(12) United States Patent
Ohlsson et al.

(10) Patent No.: US 8,178,403 B2
(45) Date of Patent: May 15, 2012

(54) METHOD OF PRODUCING PRECISION VERTICAL AND HORIZONTAL LAYERS IN A VERTICAL SEMICONDUCTOR STRUCTURE

(75) Inventors: Jonas Ohlsson, Malmö (SE); Lars Samuelson, Malmö (SE); Erik Lind, Malmö (SE); Lars-Erik Wernersson, Lund (SE); Truls Löwgren, Malmö (SE)

(73) Assignee: QuNano AB, Lund (SE)

( * ) Notice: Subject to any disclaimer, the term of this patent is extended or adjusted under 35 U.S.C. 154(b) by 67 days.

(21) Appl. No.: 12/441,223

(22) PCT Filed: Sep. 18, 2007

(86) PCT No.: PCT/EP2007/059846
§ 371 (c)(1),
(2), (4) Date: Oct. 5, 2009

(87) PCT Pub. No.: WO2008/034823
PCT Pub. Date: Mar. 27, 2008

(65) Prior Publication Data
US 2010/0102380 A1     Apr. 29, 2010

(30) Foreign Application Priority Data

Sep. 18, 2006  (SE) ...................................... 0601997
Aug. 17, 2007  (SE) ...................................... 0701885

(51) Int. Cl.
*H01L 21/76*     (2006.01)
(52) U.S. Cl. .................. 438/212; 257/329; 257/E21.19; 257/E29; 257/262; 977/888; 977/890

(58) Field of Classification Search ............. 257/E21.19, 257/E29.262; 977/888, 890; 438/412, 212
See application file for complete search history.

(56) References Cited

U.S. PATENT DOCUMENTS

| 6,004,856 | A | * | 12/1999 | Mazure-Espejo et al. .... 438/396 |
| 7,223,444 | B2 | | 5/2007 | Deppert et al. |
| 7,335,908 | B2 | | 2/2008 | Samuelson et al. |
| 7,354,850 | B2 | | 4/2008 | Seifert et al. |

(Continued)

FOREIGN PATENT DOCUMENTS
DE   199 33 564 C1   1/2001

OTHER PUBLICATIONS

Thelander et al. "Development of a Vertical Wrap-Gated InAs FET", IEEE Transactions on Electron Devices, vol. 55, No. 11, Nov. 2008, pp. 3030-3036.*

(Continued)

*Primary Examiner* — Matthew Landau
*Assistant Examiner* — Sonya McCall Shepard
(74) *Attorney, Agent, or Firm* — The Marbury Law Group, PLLC

(57) ABSTRACT

The present invention relates to providing layers of different thickness on vertical and horizontal surfaces (15, 20) of a vertical semiconductor device (1). In particular the invention relates to gate electrodes and the formation of precision layers (28) in semiconductor structures comprising a substrate (10) and an elongated structure (5) essentially standing up from the substrate. According to the method of the invention the vertical geometry of the device (1) is utilized in combination with either anisotropic deposition or anisotropic removal of deposited material to form vertical or horizontal layers of very high precision.

10 Claims, 17 Drawing Sheets

U.S. PATENT DOCUMENTS

| | | |
|---|---|---|
| 7,432,522 B2 | 10/2008 | Samuelson et al. |
| 7,528,002 B2 | 5/2009 | Samuelson et al. |
| 2003/0010244 A1 | 1/2003 | Ettmueller |
| 2004/0075464 A1 | 4/2004 | Samuelson et al. |
| 2004/0188738 A1* | 9/2004 | Farnworth et al. ............ 257/296 |
| 2005/0011431 A1 | 1/2005 | Samuelson et al. |
| 2005/0017171 A1 | 1/2005 | Samuelson et al. |
| 2005/0224888 A1 | 10/2005 | Graham et al. |
| 2006/0057360 A1 | 3/2006 | Samuelson et al. |
| 2007/0206488 A1 | 9/2007 | Thelander et al. |
| 2008/0105296 A1 | 5/2008 | Samuelson et al. |
| 2008/0142784 A1 | 6/2008 | Samuelson et al. |
| 2008/0142926 A1 | 6/2008 | Seifert et al. |
| 2008/0149914 A1 | 6/2008 | Samuelson et al. |
| 2008/0149944 A1 | 6/2008 | Samuelson et al. |
| 2008/0188064 A1 | 8/2008 | Samuelson et al. |
| 2009/0014711 A1 | 1/2009 | Samuelson et al. |
| 2009/0253250 A1 | 10/2009 | Samuelson et al. |

OTHER PUBLICATIONS

Merriam-Webster's Definition of precision (Sep. 3, 2011).*
U.S. Appl. No. 11/922,242, filed Jun. 16, 2006, Wernersson et al.
U.S. Appl. No. 11/922,243, filed Jun. 16, 2006, Wernersson et al.
U.S. Appl. No. 12/003,738, filed Dec. 31, 2007, Samuelson et al.
U.S. Appl. No. 12/003,741, filed Dec. 31, 2007, Samuelson et al.
U.S. Appl. No. 12/224,822, filed Mar. 7, 2007, Samuelson et al.
U.S. Appl. No. 12/308,249, filed Jan. 14, 2008, Seifert et al.
U.S. Appl. No. 12/441,220, filed Sep. 19, 2007, Ohlsson et al.
U.S. Appl. No. 12/450,372, filed Mar. 28, 2008, Wernersson.
U.S. Appl. No. 12/450,373, filed Mar. 26, 2008, Samuelson et al.
U.S. Appl. No. 12/499,491, filed Jul. 2, 2009, Ohlsson et al.
U.S. Appl. No. 12/520,125, filed Dec. 22, 2007, Pedersen et al.
Bryllert et al., "Vertical High-Mobility Wrap-Gated InAs Nanowire Transistor," IEEE Electron Device Letters, May 2006, 27(5):323-325.

* cited by examiner

METHOD OF PRODUCING PRECISION VERTICAL AND HORIZONTAL LAYERS IN A VERTICAL SEMICONDUCTOR STRUCTURE

CROSS-REFERENCE TO RELATED APPLICATIONS

This application is a National Stage application of PCT/EP2007/059846, filed Sep. 18, 2007, which claims priority from Swedish applications SE 0601997-0, filed Sep. 18, 2006 and SE 0701885-6, filed Aug. 17, 2007.

TECHNICAL FIELD

The present invention relates to gate electrodes and the formation of precision layers in semiconductor structures comprising a substrate and an elongated structure essentially standing up from the substrate. In particular the invention relates to a wrap gate field effect transistor with a nanowire or nanowires as an essential member of the path for electrical current.

BACKGROUND

Semiconductor devices have, until recently, been based on planar technology, which imposes constrains in terms of miniaturization and choices of suitable materials, which will be further described below. The development of nanoscale technology and in particular the ability to produce nanowires has opened up a possibility of designing vertical semiconductor devices. For the purpose of this application a vertical semiconductor device should be interpreted as a device comprising of a substrate and at least one protruding structure, the protruding structure for example grown from the substrate. The protruding structure should be essential for the functionality of the device, for example forming the current-carrying channel. The length of the protruding structure is essentially longer than the diameter of the structure and the portion of the protruding structure not in contact with the substrate is substantially larger than the portion in contact with the substrate. Depending on the substrate surface, materials, and growth methods, different growth directions will be preferred, all such directions are meant to be included in the term vertical semiconductor device. In the following the protruding structures are exemplified with nanowires.

Semiconductor materials with narrow band gap, hereinafter referred to as III/V semiconductors, such as InAs and InSb, have high mobilities, high saturated carrier velocities and low contact resistances. This makes the materials good candidates for high-speed and low-power electronics, and over the recent years the interest in using these materials in a large variety of semiconductor devices has shown a significant increase. However, transistors made of these materials often suffer from poor current control, small current on/off ratios, strong thermal effects, and a large output conductance related to the narrow band gap. In addition, structures of III/V semiconductors should preferably, in order to be commercially interesting, be compatible with existing silicon based technology, for example be possible to fabricate on Si-substrates. This is, with conventional technology, difficult, due to the large lattice mismatch between Si and III/V semiconductor materials. These above mentioned effects limit the application areas of the III/V semiconductors devices and reduce the performance of analogue and digital applications.

Semiconductor materials with wide bandgap, hereinafter referred to as nitride semiconductors, such as GaN, InGaN, and AlGaN, are well suited for high voltage and high power applications. However, transistors made of these materials suffer from poor material quality due to high material mismatch between the nitrides semiconductors and the substrate they are fabricated from. Also, the high cost of substrates, as sapphire and SiC limit the potential application areas of nitride semiconductor devices.

In a typical planar Field Effect Transistor (FET) the source-drain current is confined to a planar layer of semiconductor material. This means that it is not possible to use heterostructures in the direction of the current path in the channel to improve the performance, as is done in vertical, for instance bipolar, transistors. It is also difficult to fabricate heterostructures with narrow bandgap materials: in III/V semiconductors due to the lack of suitable lattice matched materials and problems with Sb-based compounds, and for Ge, the large lattice mismatch to Si and SiC.

The growth of nanowires offers new possibilities in heterostructure design as radial strain relaxation allows a large range of new compositions to be fabricated. InP can, for example, be grown on InAs without defects as described by Samuelson et al., U.S. Patent Application US 2004/0075464 A1. It is also possible to use a substrate that is not lattice matched to the wires, which offers even more design flexibility and opens up a route to integrate III-V semiconductors on Si. Thus the above described problems can be mitigated by the use of devices of nanoscale dimensions. Hence, structures comprising nanowires are of special interest and will throughout the application be used as a non-limiting example. However, the method and device according to the present invention are, as appreciated by the skilled in the art, not limited to devices of nanoscale dimension, also larger structure could be envisaged.

Semiconductor nanowires is in this context defined as rod-shaped structures with a diameter less than 200 nm and a length up to several μm. The growth of semiconductor nanowires can be done in various ways, for example by Metal Organic Vapor Phase Epitaxy (MOVPE) using metal particles to assist the anisotropic growth, often referred to Vapor Liquid Solid growth (VLS), as in the above referred US application to Samuelson et al. Another proven method of growing epitaxial nanowire structures is by Selective Area Epitaxy (SAE).

Such protruding structures, as vertical devices, and nanowires set new demands on associated process steps and new process steps will have to be designed and invented in order to achieve precise device design. Especially, this is true for the process steps following after the vertical part of the device has been fabricated, post-growth processing in the nanowire device concept. Such process is the fabrication of layers where a precise surface area between the vertical part and the layer is of importance or where a high degree of flatness of the layer close to the nanowire is needed. The nanowire will act as a perturbation in the post-growth fabrication of any film, layer, electrode, or isolation that the nanowire shall protrude. This perturbation can be in form of shadowing of the film deposition or adhesion of the film onto the nanowire sidewalls.

A nanoscaled wrap gate field effect transistor comprises a nanowire as a current-carrying channel. In one end of the nanowire a source electrode, or source contact, is provided and in the opposite end a drain electrode/contact. Between the source electrode and drain electrode is a gate electrode/contact arranged. The gate contact encloses, or wraps, the nanowire and covers a portion, the gate portion of the nanowire. The gate portion defines a gate length. The gate length has great influence on the characteristics of the device. In many applications it is desirable to have short, typically below 100 nm, gate lengths. In order to achieve devices with predictable characteristics, the gate length should also be uniform and reproducible. Previous methods for example as described in "Vertical high mobility wrap-gated InAs nanowire transistor", IEEE 2005, by Tomas Bryllert et al., gives a wrap gate that cover a major portion of the nanowire.

SUMMARY OF THE INVENTION

There is a need of providing layers, for example layers forming contacts with well defined thicknesses and positions. This is particularly important for nanoscaled vertical semiconductor devices, wherein for example the precision and reproducibility of the gate length of a gate contact is of high importance for the performance and reproducibility of the device.

The object of the present invention is to provide a method of producing well defined layers on both vertical and horizontal surfaces in vertical semiconductor devices. This is achieved by the method as defined in claim 1.

The invention relates to methods of anisotropic deposition of materials on substrate(s) with protruding structures, where the different surface directions lead to thinner and/or more porous material on the sides of the protruding structures. After removal of the thin and/or porous material, for example in a wet selective etch, a lateral layer is remaining on the substrate providing the time used for the etching is sufficiently short.

According to the method of the invention the vertical geometry of the vertical semiconductor device, providing vertical and horizontal surfaces is utilised in combination with a deposition and removal process which provides anisotropy, to produce deposited layers of the vertical and horizontal surfaces with different and well controlled thicknesses.

According to the invention a vertical semiconductor device comprising a substrate and a structure protruding from the substrate is provided. The protruding structure is enclosed in a portion of its length by at least one precision layer, and the enclosed portion of the protruding structure gives a contact length or contact area to the protruding structure. The precision layer is positioned above the substrate and the contact length is limited by the thickness of the precision layer in the proximity of the protruding structure.

According to one embodiment of the invention the precision layer is a gate and the protruding structure a nanowire forming the current channel of a FET.

The gate length of the FET is limited by the thickness of the gate layer in the proximity of the nanowire.

According to the method of the invention a precision layer is provided in a vertical semiconductor device comprising a substrate and a structure protruding from the substrate. In the method the precision layer is deposited vertically, or with an angle, onto the substrate and the thickness of the precision layer is controlled so that the thickness of the precision layer limits a contact length with the protruding structure.

The deposition of the precision layer is in one embodiment anisotropic and preferably performed using a tilted angle between the protruding structure(s) and the material deposition direction, and by rotating the substrate during deposition.

A further embodiment utilizes one or more sacrificial layers and comprises the steps of:
 depositing of a sacrificial layer;
 depositing a mold layer on top of the sacrificial layer;
 selectively removing at least one part of the mold layer;
 selectively removing at least one part of the sacrificial layer;
and wherein the deposition of the precision layer is isotropic.

Thanks to the processes according to the invention, making it possible to fabricate vertical structures in a precise fashion, one can develop new concepts of device geometries, as here exemplified by a gate structure where no critical size is limited by lithographical definition, but by deposition, introducing a preciseness and potential of device miniaturization that is not possible by lithographical means. A layer may be deposited with two different thicknesses, one on the nanowire sidewalls and one in angle to the nanowire. In this way a multistep process is minimized to one single process step. The precision refers both to thickness of the deposited layer, for example defining a gate length, and also to the positioning of the layer. Even taking in account that a precision layer produced with the method according to the invention could show some thinning close to the nanowire, these effects will be possible to predict in a precise manner, and most importantly will be reproducible. In addition the method facilitates the deposition of high quality layers on both vertical and horizontal surfaces.

Embodiments of the invention are defined in the dependent claims. Other objects, advantages and novel features of the invention will become apparent from the following detailed description of the invention when considered in conjunction with the accompanying drawings and claims.

BRIEF DESCRIPTION OF THE DRAWINGS

Preferred embodiments of the invention will now be described with reference to the accompanying drawings, wherein.

DETAILED DESCRIPTION

Figure 1A:
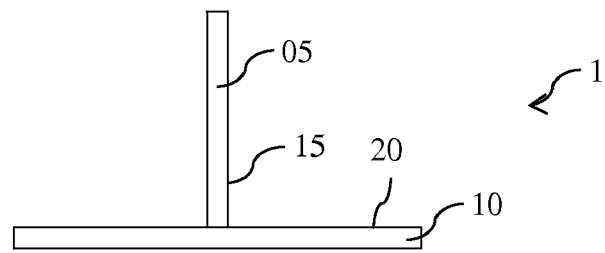
FIG. 1 illustrates schematically the steps of the method according to the present invention.

Characteristic for a vertical semiconductor device 1, to which the method according to the invention relates, is a protruding structure 5 upstanding from a substrate 10 as schematically illustrated in FIG. 1a. The substrate is referred to as the bottom of the device and the upper surface, or the upper surface of any layer or layers covering the top of the nanowires, is referred to as the top of the device. The protruding structure 5 has at least one surface 15 that forms an angle in the range 25-90° to the substrate surface 20, or a surface parallel to the substrate surface. Hereinafter, the term horizontal surface 20 will be used referring to the substrate surface 20 or a surface parallel to the substrate surface. Correspondingly, the term vertical surface is used to refer to the surface 15 of the protruding structure 5 or a surface of an layer enclosing the protruding structure 5. The surface 15 of the protruding structure 5 is typically the envelope surface of a nanowire. In the background it is described how the protruding structure 5, may act as a perturbation in certain post-growth processing steps, for example in depositing of layers on the substrate 10. According to the method of the invention the feature that the vertical semiconductor device comprises at least two surfaces, the substrate surface 20 and the surface of the protruding structure 15, with a distinct angle there between, is utilised to give a selective surface deposition. The resulting device will have a selected layer essentially parallel to only one of the substrate surface 20 and the surface of the protruding structure 15.

Figure 1B:
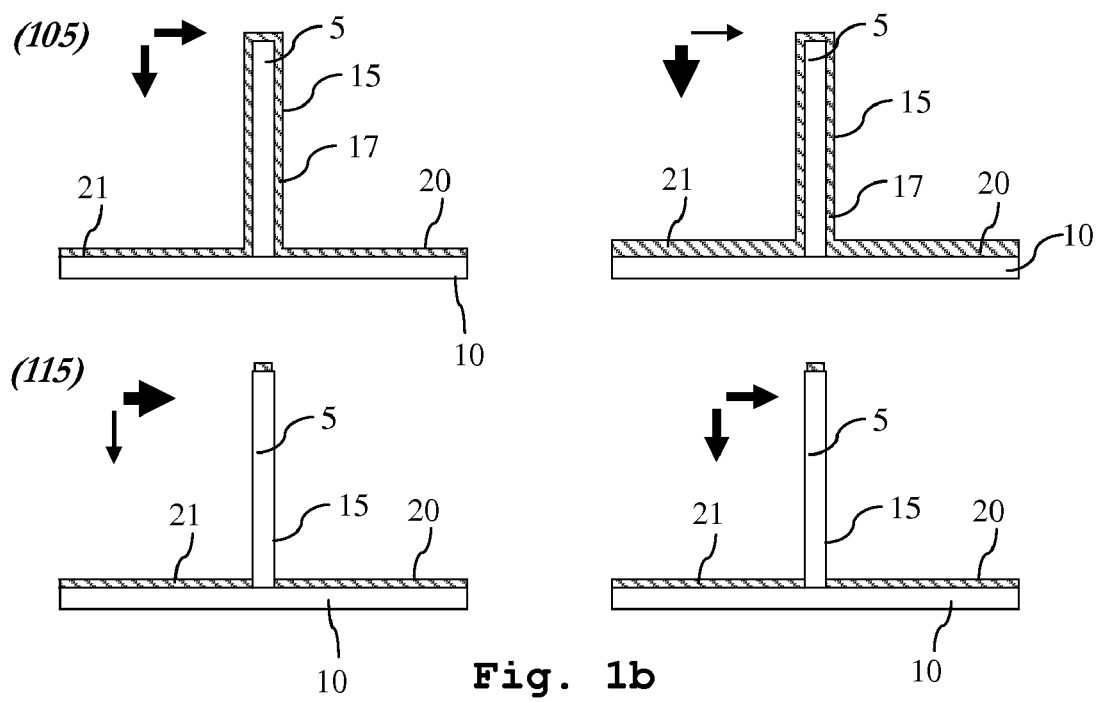

The method according to the invention, schematically illustrated in FIG. 1b comprises the main steps:
- a deposition step (105) wherein a layer material is deposited upon both the vertical surface 15 and the horizontal surface 20, forming a vertical layer 17 and a horizontal layer 21. The deposition may be isotropic (as indicated with arrows of equal width) or anisotropic (as indicated with arrows of different width), and
- a removal step (115), following the deposition step (105), wherein either the vertical layer 17 or the horizontal layer 21 is removed. The removal should be anisotropic (as indicated with arrows of different width), if the deposition was isotropic. If the deposition was anisotropic the removal could be isotropic (as indicated with arrows of equal width), but also an anisotropic removal could be envisaged, in which case the anisotropy should be of the same type. Alternatively the removal is terminated before any of the layers is completely removed, instead leaving one of the vertical or horizontal layers thinner than the other. Typically and preferably one of the layers has a thickness which is below half of the thickness of the other.

Figure 1C:
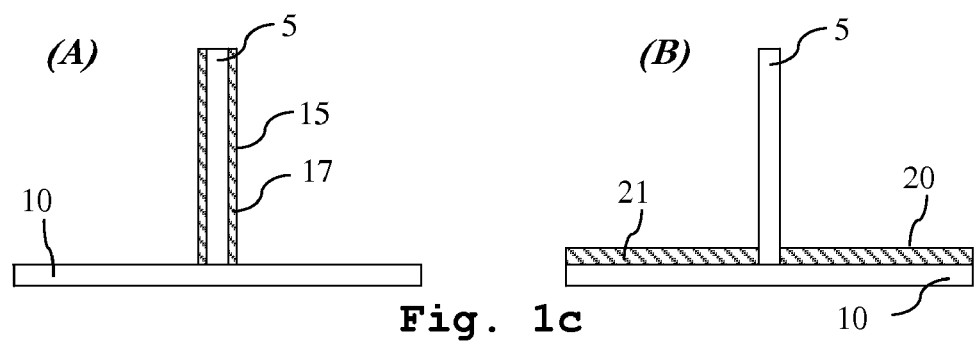

The main steps results in either a vertical layer 17 ('A' in the figure) on the envelope of the protruding structure 5 or a horizontal layer 21 ('B') parallel to the substrate surface 15 as illustrated in FIG. 1c. These steps are typically only a part of a post-growing process, wherein a plurality of layers of different properties is added to form the final vertical semiconductor device 1.

The method of the invention can be used to form well defined members of the vertical semiconductor, for example contacts, terminals, gates, spacer layers, elevation layers, isolation layers, chargeable layers, and dielectric layers. Materials for the layer can be chosen from a wide range including conducting material and insulators, as will be further discussed below. In the embodiments described below the protruding structure 5 is a nanowire, or a structure comprising a nanowire, grown from a substrate 10 or a base layer on the substrate 10. The vertical surface 15 is a sidewall of the nanowire, or a sidewall on a layer grown or applied by other means on the nanowire. The horizontal surface 20 may be the surface of the substrate 10, or the upper surface of a layer applied on the substrate.

A wide range of deposition techniques could be used, for example evaporation, sputtering, chemical vapour deposition (CVD) and atomic layer deposition (ALD). The choice of deposition technique will depend both on the deposition material and if isotropic or anisotropic deposition is required. Evaporation is typically highly anisotropic, while CVD-based techniques typically are isotropic. Sputtering can be made to be either anisotropic or isotropic depending on pressure and other parameters. Suitable removal techniques include anisotropic and isotropic etching and ablation methods such as laser ablation. Light influenced etching techniques are suitable for this invention as they provide a designed directional anisotropy provided by the relative positioning of the light source. Deposition techniques as well as etching and ablation methods are well known in the art and products commercially available, and the skilled person would, given the prerequisites of the method of the invention, be able to find suitable combinations of deposition techniques, removal techniques, and etching substances.

The performance of vertical semiconductor devices is, as described in the background section, in many cases dependent on the accuracy and reproducibility of members contacting and/or interacting with the protruding structure. Such members will be referred to as precision layers. A precision layer may be any electrode/contact layer and/or insulating layer in angle to the protruding structure vertical direction, wherein a high definition in the contact area to the nanowire or/and layer flatness close to the nanowire is of importance. A contact length is defined as the length of the part of the precision layer facing the protruding structure. According to one embodiment of the invention a precision layer is formed giving a contact length which is essentially limited by the thickness of the contact layer in the proximity of the protruding structure. A typical example of a precision layer is a gate electrode enclosing a portion of a nanowire in a nanoscale FET, and in the present embodiment the precision layer will be exemplified with a gate electrode/layer, and the high definition contact area with the gate length. Preferably and typically the gate layer does not extend in the direction of the nanowire beyond the thickness of the layer.

Vertical semiconductor devices comprising a wrap-gate are based on at least one vertical structure, typically a nanowire, around which a gate electrode is formed by post-growth processing. The gate electrode is typically used to induce an electrical field effect, in similarity with a conventional field effect transistor (FET). The wrap-gate electrode, typically formed by a gate layer, must here be separated from the source and drain by insulator layers. One or a plurality of the layers can be formed with the method according to the invention, but the embodiments are mainly exemplified with the gate layer as a precision layer. The insulating layers may also be used as spacer layers to provide a well defined height relative the nanowire for the gate layer. A plurality of separate layers may be used to form the spacer layer and insulating layer. Materials with a band gap narrower than Si (like InAs, InSb, and the alloys of In, As, Ga, Sb and P) are preferably used in the nanowires in order to enhance the device properties via increased mobility and saturated electron velocity.

The nanowires, which act as channels in the transistors, may have been grown using selective epitaxy where particles are used to assist the anisotropic growth. Chemical Beam Epitaxy or different types of Vapour Phase Epitaxy methods may be employed for the growth. Lithographic methods or metal particle deposition are used to define the metal particles and the size of the metal particle determines the diameter of the wires. Typically, diameters below 200 nm, with a standard deviation of 5%, can be fabricated. Wires only grow at the defined locations and the planar growth rate is negligible in this particle assisted growth mode. Suitable methods for growing nanowires on semiconductor substrates are described in US 2003/010244. Methods of providing epitaxially grown nanowires with heterostructures are to be found in US 2004/0075464. As an alternative, selective area epitaxy (SAE) can be used to grow nanowires or other nanostructures.

Figure 2:
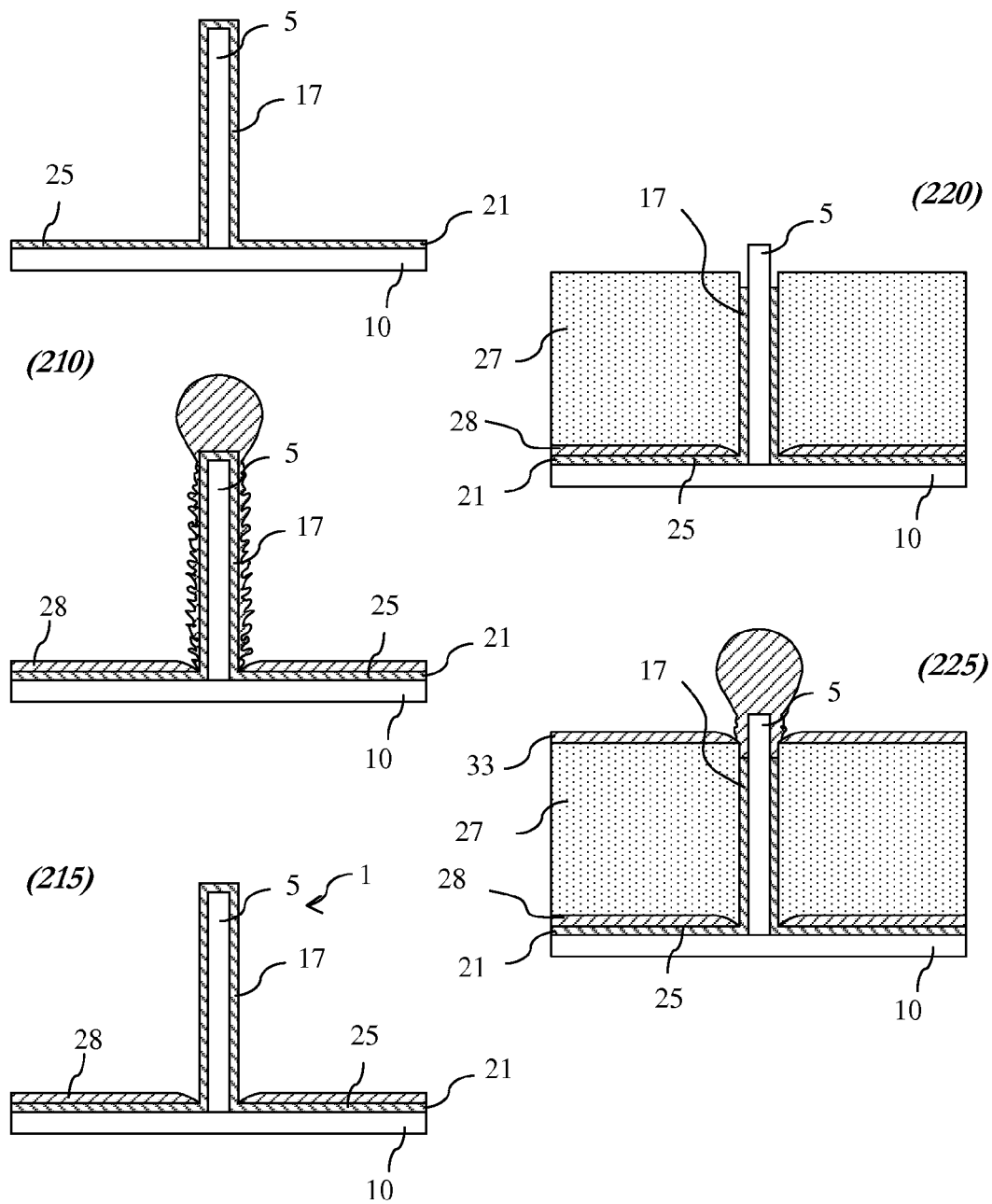
FIG. 2 illustrates the method of producing a gate layer, and the device comprising a gate layer according to the invention.

The method according to the embodiment is illustrated in FIG. 2. The method comprises the steps of:

205: Isotropic deposition of a dielectric and isolation layer 25, e.g. made of $SiN_x$, on the substrate and the nanowire. The isotropic deposition will yield a uniform layer 17, 21 on the vertical and horizontal surfaces 15, 20.

210: Anisotropic deposition of a gate layer 28. The deposition of the gate layer 28 is accurately controlled to give a layer of a predetermined thickness. The thickness of the layer 28 in the proximity of the nanowire 5 will limit the gate length. Alternatively the gate layer 28 is treated in subsequent steps to form a layer of the required thickness, for example using precision etching.

215: Optional removal, for example by etching, of unwanted gate layer material primarily on vertical parts of the nanowire 5.

220: Providing an insulating layer 27, for example BCB.

225: Deposition of a top layer 30, for example forming a metallic top contact.

The vertical semiconductor device 1 according to the embodiment will, as illustrated in FIG. 2, have gate electrode arrangement wherein the gate length is limited by the thickness of the gate layer 28. The gate layer 28 should preferably be uniform. However, experimental results seem to indicate that a slight incline, possibly due to shadowing effects, can be observed close to the nanowire 5. Such deviation has been shown not to impede the performance and does not affect the reproducibility of the method. A prerequisite for letting the thickness of the gate layer 28 define the gate length is the vertical structure. It should be noted that devices with structures deviating from a 90° angle to the substrate also may receive a well defined gate length with the above method. The method is not limited to gate electrode layers. The method could advantageously be used for the design of any electrode/contact layer and/or isolating layer in angle to the nanowire vertical direction, wherein a high definition in the contact area to the nanowire or/and layer flatness close to the nanowire is of importance. The method could be used for producing well defined ohmic contacts on the nanowire. The spread of these layers in the directions of the layer plane may be defined through lithographic means or not. Especially lift-off technique is compatible with the invention.

The method according to the invention may be varied in ways illustrated by the below described embodiments. According to one embodiment, illustrated in FIG. 3, the anisotropic deposition of step 310 is performed by:

1. Using an incident angle, i.e. the angle between the normal of the substrate and the material deposition direction, which deviates from zero. An angle >0° and <45° can be used. Preferably an angle below 20° is used and even more preferably an angle in the interval 10-15°.

2. Rotating the sample during deposition. The sample is rotated around the direction of the nanowires or the normal of the substrate surface.

If a single (perpendicular) layer is wanted a precise etch step is used to take away the deposit on the nanowire/vertical structure (step 315).

In this way a precision layer 28 can be fabricated with the properties:

1. Precise definition in height (Since the height is defined by a deposition step. By deposition, thickness can easily be controlled down to 1 Å as compared to lithographic steps where best definition is lower than 1 nm. And often less than 10 nm.
2. High flatness close to the nanowire 5 and/or precise contact area to the vertical sidewalls of the nanowire/device.

Even at zero degree incidence angle evaporated material will always attach to the nanowire (NW) sidewall surface. This material will for small incidence angles be porous. A combination of a small tilt with rotation gives only a small amount of fairly uniformly distributed amorphous material on the sidewalls of the NWs 5. This material has a considerably faster etch rate than the material on the gate layer plane. The material on the NW sidewalls can then be etched away leaving the gate metal layer intact.

Figure 3:
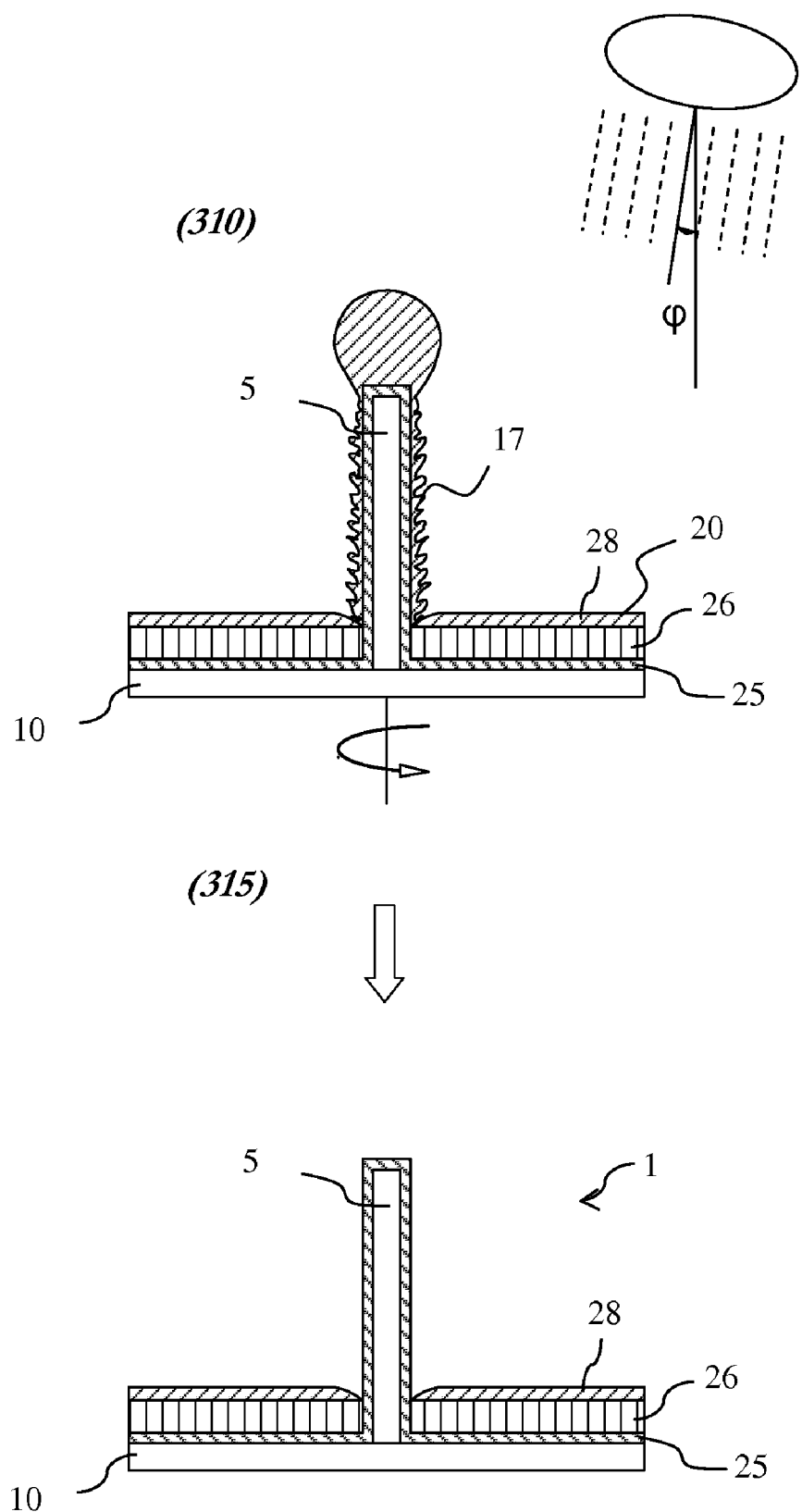
FIG. 3 illustrates the method of producing a gate layer according to one embodiment of the invention operating at a first angle.
Figure 4:
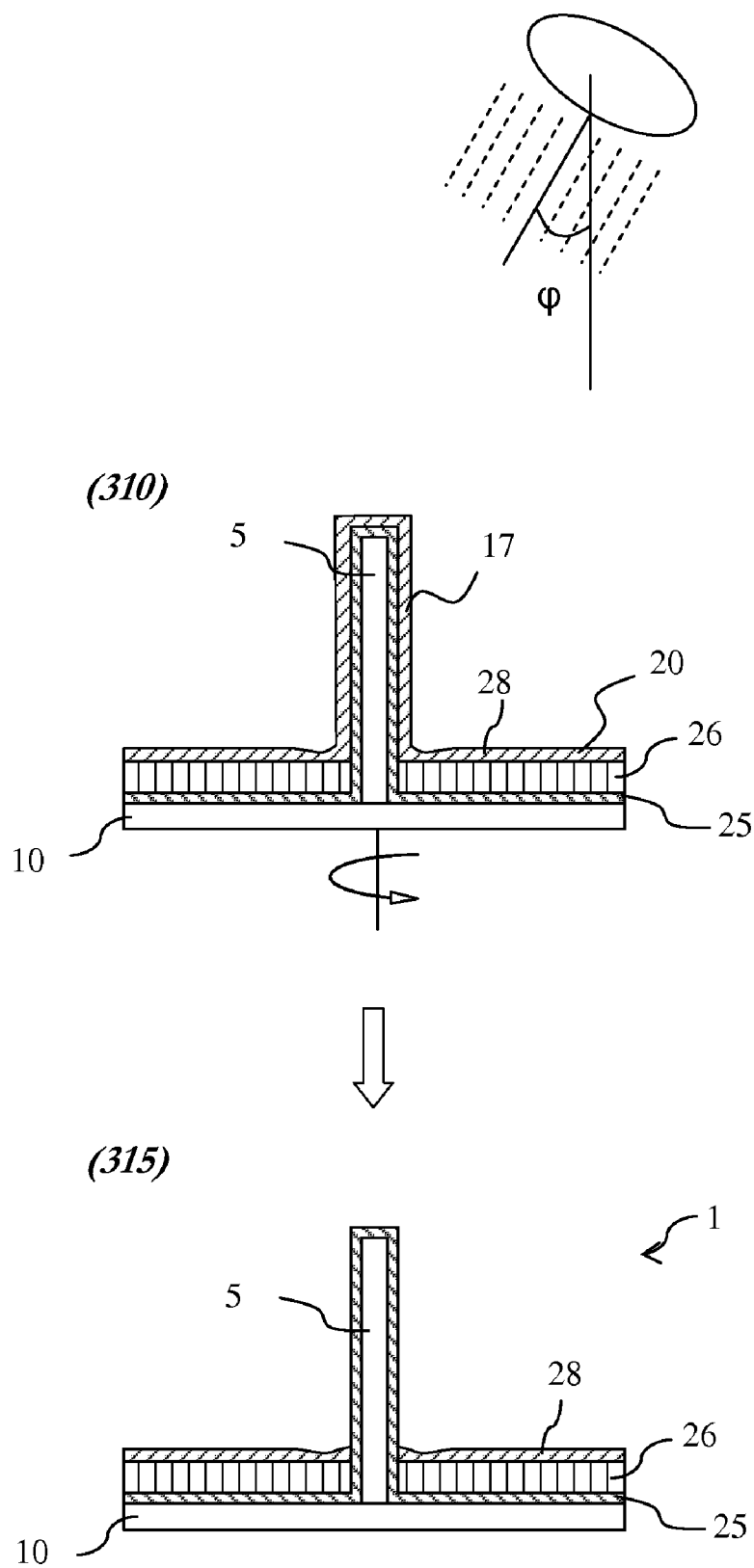
FIG. 4 illustrates the method of producing a gate layer according to one embodiment of the invention operating at a second angle.

FIG. 3 illustrates a deposition using a small incident of the material deposition direction. In FIG. 4 a deposition process using a substantially larger angle is depicted. FIGS. 3 and 4 illustrate the two mechanisms combined in the method. Depending on the desired result, material and deposition method (material granularity, temperature, degree of anisotropy, pressure, deposition speed, and angle) different combinations of the two mechanisms can be chosen by altering the incidence material beam angle in relation to the sample.

By the tilting angle one can design the thickness ratio between the layer 17 on the vertical sidewalls on the nanowire 5 and the planar layer 20. One example of when this is of use is in FET fabrication when combining the deposition of the dielectric layer 25 that space the gate from the surface and the deposition of the gate barrier on the nanowire sidewalls 15. If capacitance between the gate electrode 28 and the substrate 10 is of importance for the device performance a structure with a thicker dielectric layer on the substrate than on the vertical sidewalls is advantageous. The material of the dielectric layer should be a high k-value material that can be deposited in thin layers, preferably less than 10 nm with high uniformity.

At larger incidence angles evaporated material will be of good quality both on the sidewalls of the NWs as well as on the gate layer plane. Even at an incidence at 45° the thickness of evaporated material on the sidewalls of the NWs will be less than the thickness on the gate layer plane. This is due to that a particular part of the NW sidewall only faces the evaporation source a fraction of (always less than half) the time due to rotation and a non zero incident angle. The gate layer plane on the other hand faces the evaporation source all the time except when it is shadowed by the NW. The thickness ratio can be designed altering the incidence angle, increasing the ratio by decreasing the incidence angle further. Precise (the thickness of the vertical layer) homogeneous etching of the layers will give a gate layer plane, the definition given by Layer thickness=original thickness−vertical layer thickness.

Repetition of the method makes it possible to design, spacer layer thickness, gate barrier thickness, and gate length by this method.

The nanowire FET is used as example. The method can be used for any vertical device or vertical nanowire device as well as devices based on features protruding from a substrate. One example being devices based on (111)-nanowires wires on (100) substrates.

The vertical device can be based on a nanowire 5 where lateral expansions have been added by growth or other processing.

Ideally the rotation speed should be high compared to the deposition speed in order to not induce large variation in deposition conditions.

If the there is room in the process (high enough ratio between the vertical and horizontal layer) one can decrease the anisotropy in order to increase the homogeneity of the layers.

Figure 5:
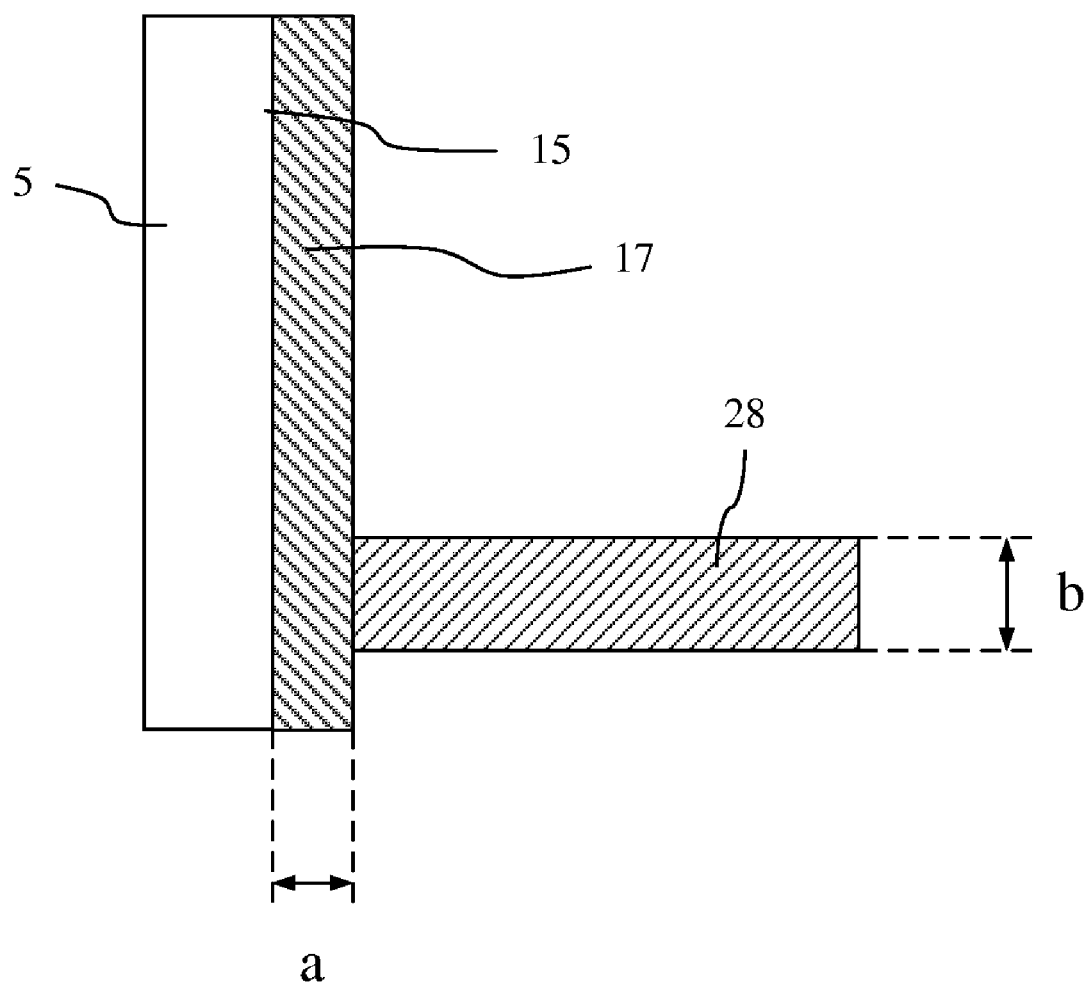
FIG. 5 illustrates the nanowire, the dielectric layer and the gate length defined by the gate layer thickness in a device according to the invention.

An example of a product manufactured according to the inventive method is the gate structure depicted in FIG. 5. In this structure the gate barrier material is deposited onto the nanowire 5 (possibly by isotropic deposition like isotropic sputtering or ALD). The gate layer 28 is fabricated by the method according to the invention. In this way the two critical parameters in the gate structure, a gate barrier thickness and b gate length, are defined by deposition steps. This makes it possible to shrink the gate feature sizes in a way that would not be possible when any of the features would be defined by lithographical means.

Figure 6A:
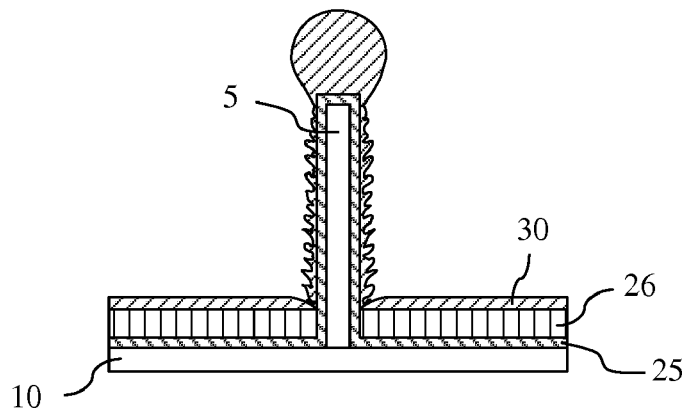
FIGS. 6 a and b illustrates the method of producing a gate layer according to one embodiment of the invention utilizing a sacrificial layer, the first steps (a) and the final steps (b), and FIG. 6c illustrate a nanowire assembly at an intermediate state in the process.
Figure 6A:
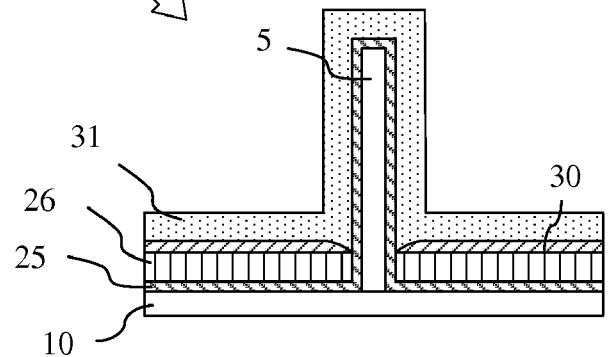
Figure 6A:
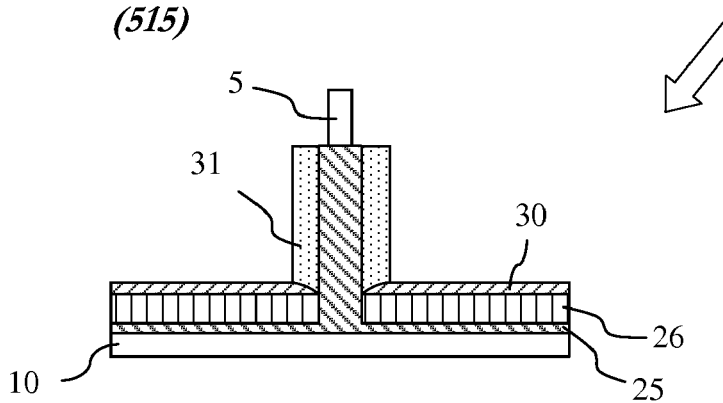
Figure 6B:
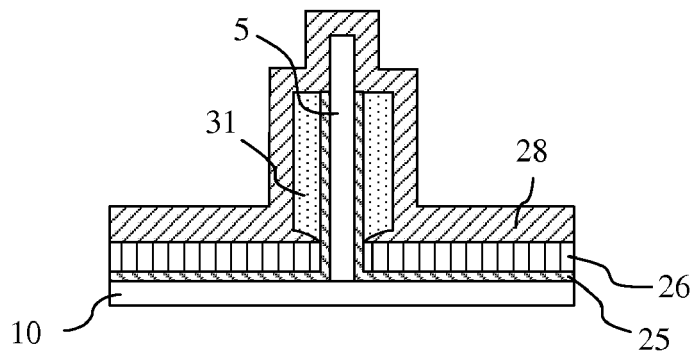
Figure 6B:
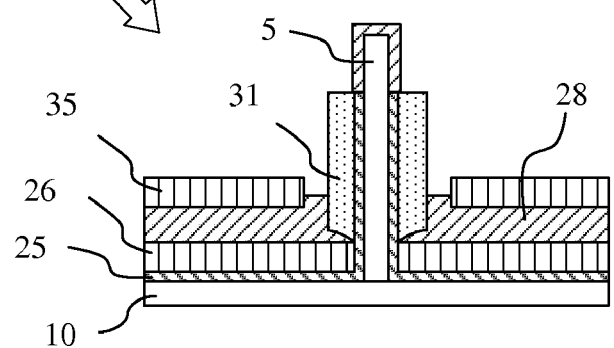
Figure 6B:
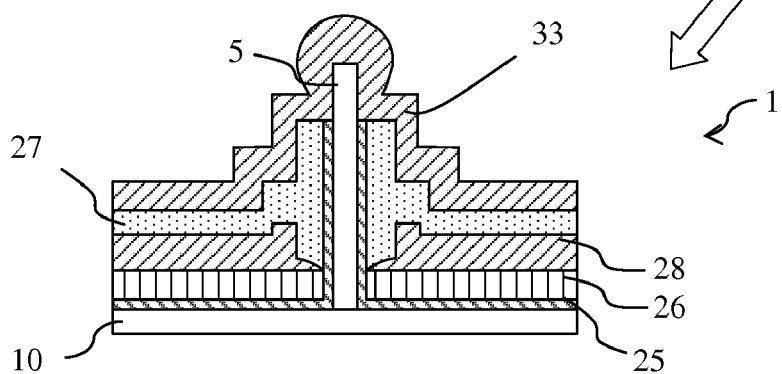

According to another embodiment of the invention a sacrificial layer or layers are used in formation of the gate layer 28. Also in this case the gate layer 28 should be seen as a non-limiting example of a precision layer. However, other well defined precision layers can, such as a sacrificial layer or a specer layer can be produced. The embodiment is illustrated in FIGS. 6a-b, and comprises the steps of:

505: Deposition of a Sacrificial Gate Layer (SGL) 30: A layer 30 of for example $SiO_x$ is evaporated. It is removed at a later stage and should be used to form a mold for the actual gate-layer 28. It is then possible to make use of properties associated with other materials and evaporation techniques than with the actual gate layer material.

510: On top of the SGL 30 a mold layer 31 is deposited. For example, $SiN_x$ could be used for this purpose.

515: The mold layer 31 on top of the SGL 30 is etched with directional RIE. The SGL 30 is then etched away selectively with for example buffered oxide etch (BOE) in the case of $SiO_x$.

520: Deposition of the gate layer 28: After the SGL 30 is removed the actual gate layer 28 will be deposited using a highly isotropic method such as sputtering or ALD. The efficient gate length is constituted by the thickness of the SGL 30 and can be controlled well below ten nm. At the same time it allows for thicker gate metal further away from the channel, reducing the gate layer resistance.

525: The excess metal surrounding the nanowire 5 will be etched away using a mask 35. This etching step does not demand great precision.

530: The gate layer 28 is then embedded in insulating material and a top contact 33 is deposited. Prior to the embedding, the gate layer thickness at sufficient distance from the channel, could be increased with for example electroplating, in order to reduce the gate layer resistance.

In the depositions according to this embodiment the tilting/rotating according to the previous embodiment may be utilised.

Figure 6C:
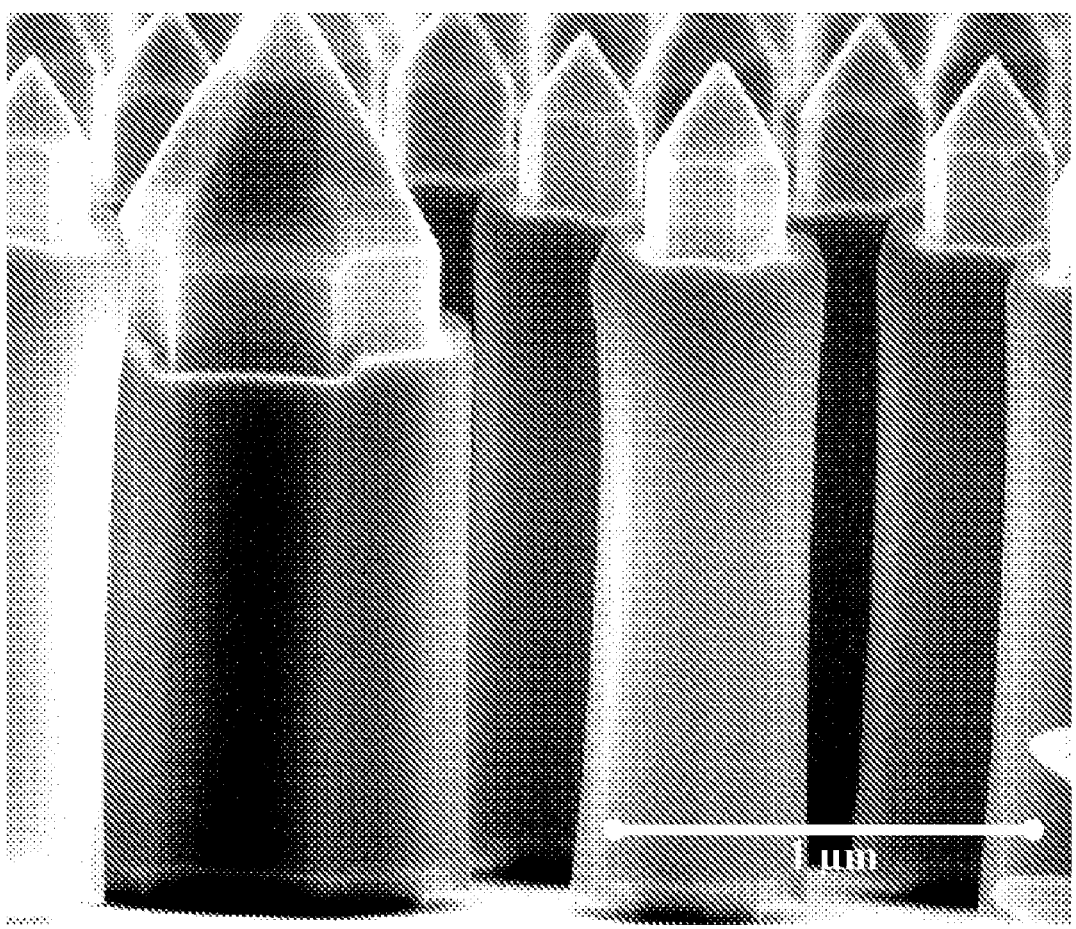

FIG. 6c illustrates with a SEM-picture the use of a sacrificial gate layer 30. The picture corresponds to the appearance of the partly embedded nanowires prior to the deposition of the actual gate layer 28 (step 520).

Figure 7:
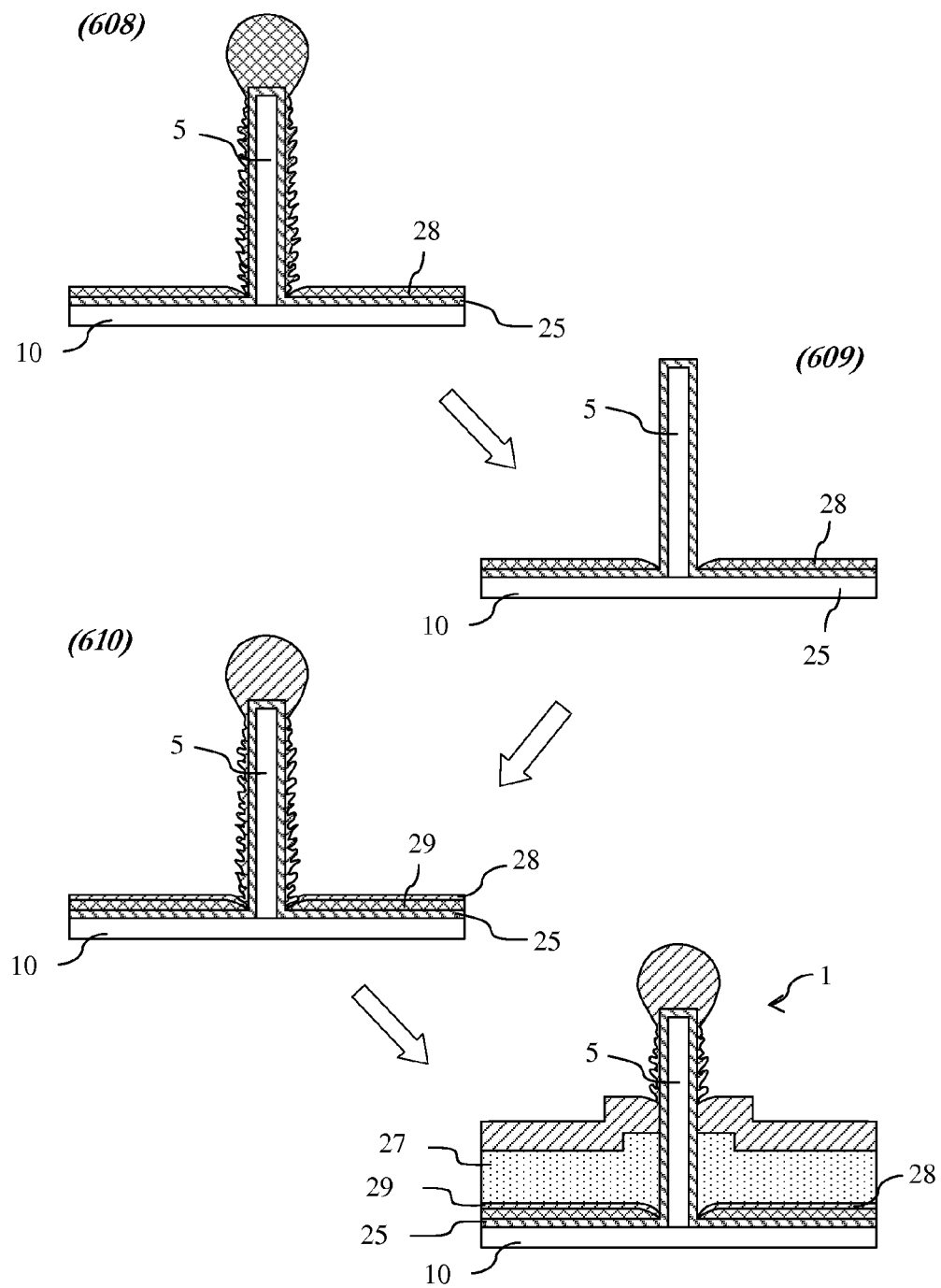
FIG. 7 illustrates the method of producing an elevated gate layer according to one embodiment of the invention utilizing an elevation layer.

According to yet another embodiment a precision layer in the form of an elevation layer or spacer layer is used to position the gate layer at a predetermined height on the nanowire 5. This is a non-limiting example of the deposition of an precision layer. Any layer in a device according to the invention may be a precision layer. The method, illustrated in FIG. 7 comprises additional steps, to be taken prior to the step of depositing the gate layer 610 of:

608: Depositing an elevation layer 28: $SiO_x$, for example, is evaporated during spinning and tilting of the sample, resulting in planar layer on surface and amorphous $SiO_x$ on the sides of the nanowires 5.

609: Etching the elevation layer 28. After etching of the amorphous $SiO_x$ on the nanowire sides an intact, horizontal layer 28 is left on the surface. The process should be possible to optimize in order to get a good profile to the nanowire.

Alternatively an elevation layer is provided by applying a spin-on material that is etched to the required thickness prior to the deposition of the gate layer 610.

The device and method according to the invention have, for the reason of clarity only, been illustrated as comprising a single nanowire 5. The method may equally well be utilized for devices with a plurality of nanowires. The nanowires 5 may be uniform or differ in shape or dimensions or composition/internal structure. The method may also be used for devices comprising branched nanowires. Using masking techniques selected groups of nanowires can be given precision layers of a first type and other selected groups of nanowires precision layers of a second type. The nanowires could be of same or other material as the substrate or any base layer on the substrate.

The device and method according to the invention have been described with the protruding structures 5 as an active member, a nanowire forming for example a current channel. Other examples of active structures include, but are not limited to, pn-junctions, LED, capacitors, resistors and sensors. Devices can be made wherein at least some nanowires or pillars are not electrically active members, rather have a structural function, for example supporting an upper layer. Also in producing such devices the method according to the invention can be advantageously utilized.

A further example wherein the method and arrangement according to the present invention may be utilised is the vertical semiconductor forming a light emitting diode (LED). The protruding structures 5, nanowires or nanostructures, can in this case be made through the same processes as with the FETs. Three examples of nanowire LED structures are schematically illustrated in FIGS. 10a-c. All three examples are based around the basic structure of an n-type, intrinsic, p-type nanowire. The labeled nanowire segments may be arranged such that a first segment 6 is n-type, a second segment 7 is intrinsic, and a third segment 8 is p-type, or such that the first segment 6 is p-type, the second segment 7 is intrinsic, and the third segment is n-type. The base layer may be the same as the first segment 6 of the nanowire 5.

Figure 8A:
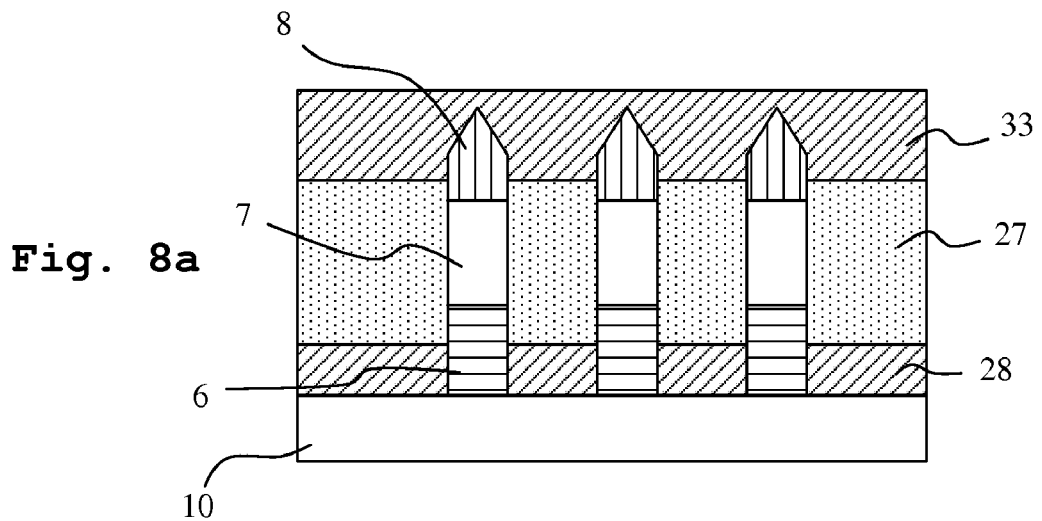
FIGS. 8a-c illustrates schematically the steps of one embodiment of the method according to the present invention.

In the example of FIG. 8a three horizontal layers are used. Two metal layers are used to contact the n and p-type segments 6, 8, the lower metal layer 28, and the upper metal layer 33. An insulating layer 27 is used to electrically isolate the metal layers. In this example both the insulating and upper metal layer 33 must be transparent for efficient extraction of the light generated in the intrinsic layer.

Figure 8B:
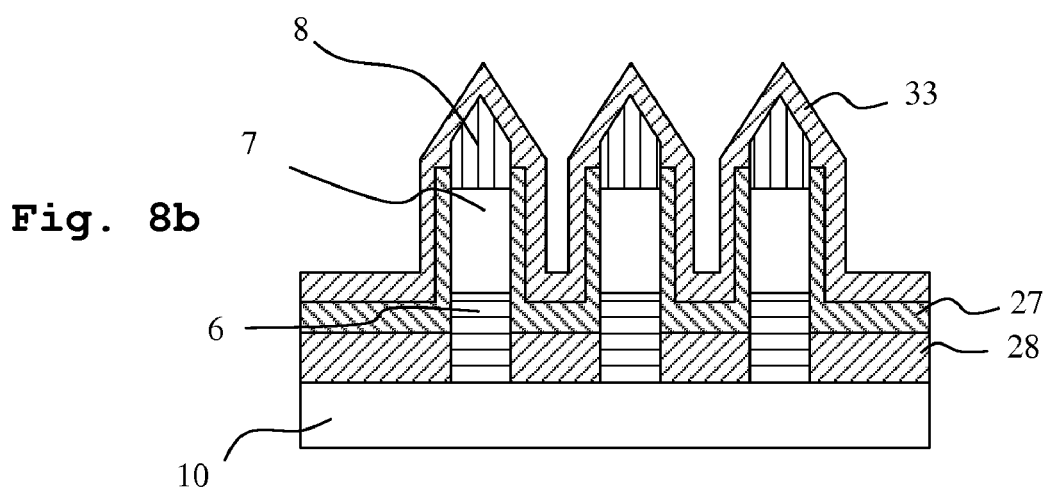

In the example of FIG. 8b an insulator and an upper metal layer 27, 33 conformal to the nanowire are provided. Also in this example both the insulating and upper metal layer must be transparent for efficient extraction of the light generated in the intrinsic layer.

Figure 8C:
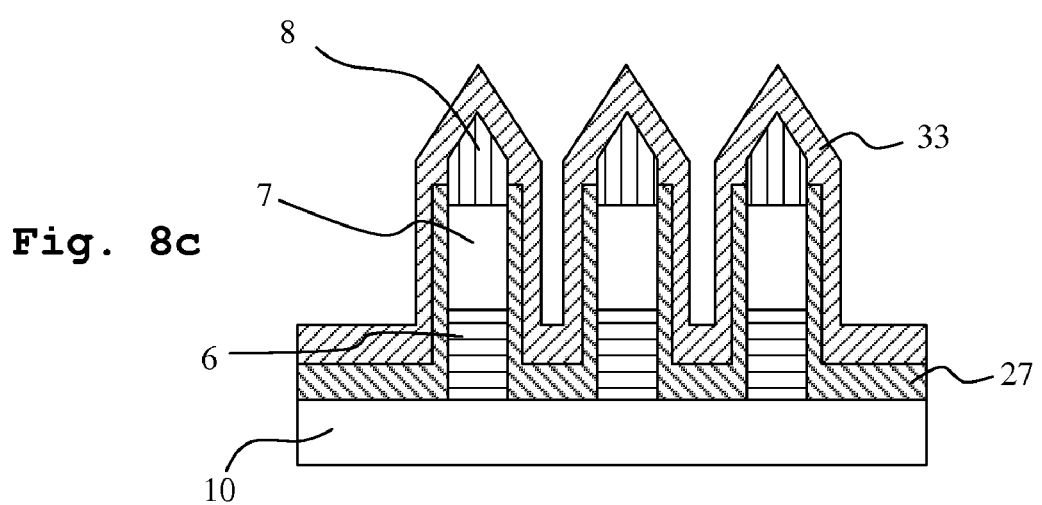

In the example of FIG. 8c first segment 6 of the nanowire 5 is contacted via the base layer 10. Hence, only one metal layer, the upper metal layer 33 is needed for the contacting of the LED.

In order to provide well defined contacting to the nanowire segments one or both of the metal layers 28, 33, and or the insulator layer 27 has been provided by the method according to the invention. In addition, it may for example be advantageous to have a thinner metal and insulating layer on the nanowires, than on the substrate, as these layers preferably are as transparent as possible.

Figure 9A:
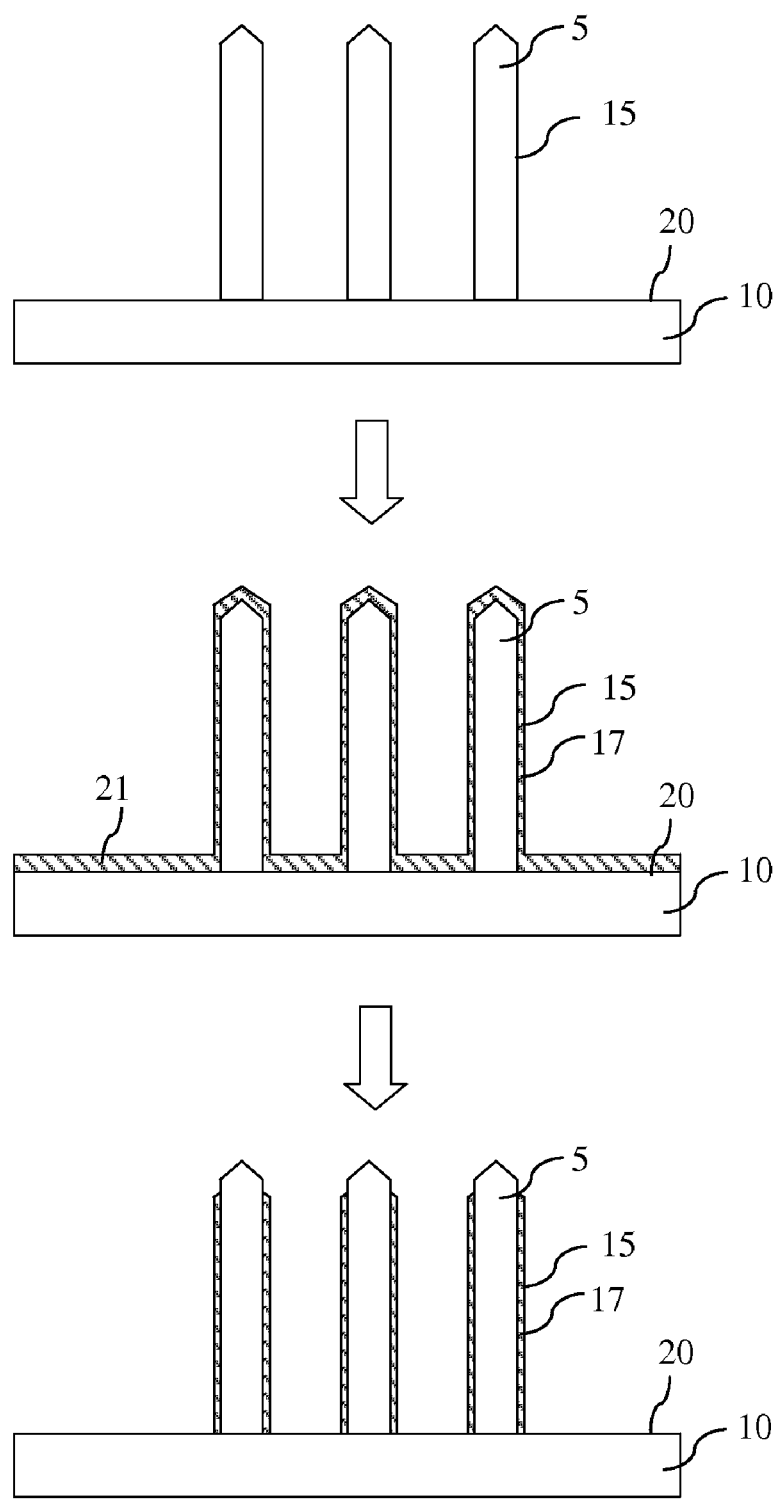
FIGS. 9a-b illustrates schematically the steps of one embodiment of the method according to the present invention, and 9c exemplifies a produced vertical semiconductor according to the invention.
Figure 9B:
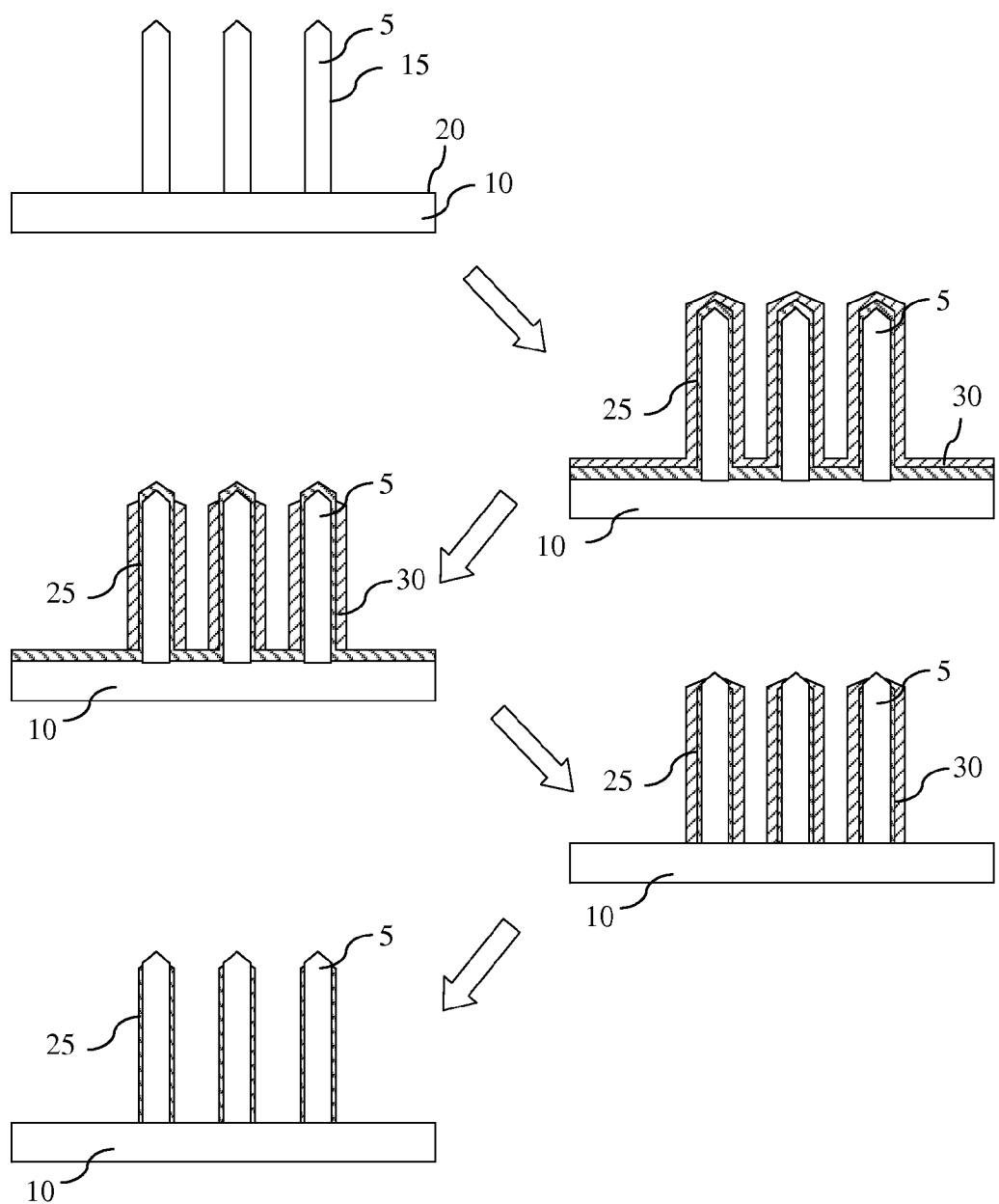

The above embodiments have mainly exemplified the use of a precision layer parallel to the substrate. As described the invention may also be used to produce well defined vertical layers on the protruding structure. In FIGS. 9a-b, procedures for producing vertical layers on a nanostructure, for example a nanowire, is schematically illustrated. The nanostructures may be grown in the same manner as described in conjunction to the FETs.

In the example of FIG. 9a a substrate with upstanding nanowires is provided. In a first step, a layer or a plurality of layers are deposited isotropically. In a second step an anisotropic etching is performed, acting mainly on the part of the layer parallel to the substrate, resulting in the deposited material forming a band on the envelope surface of the nanowire.

Figure 9C:
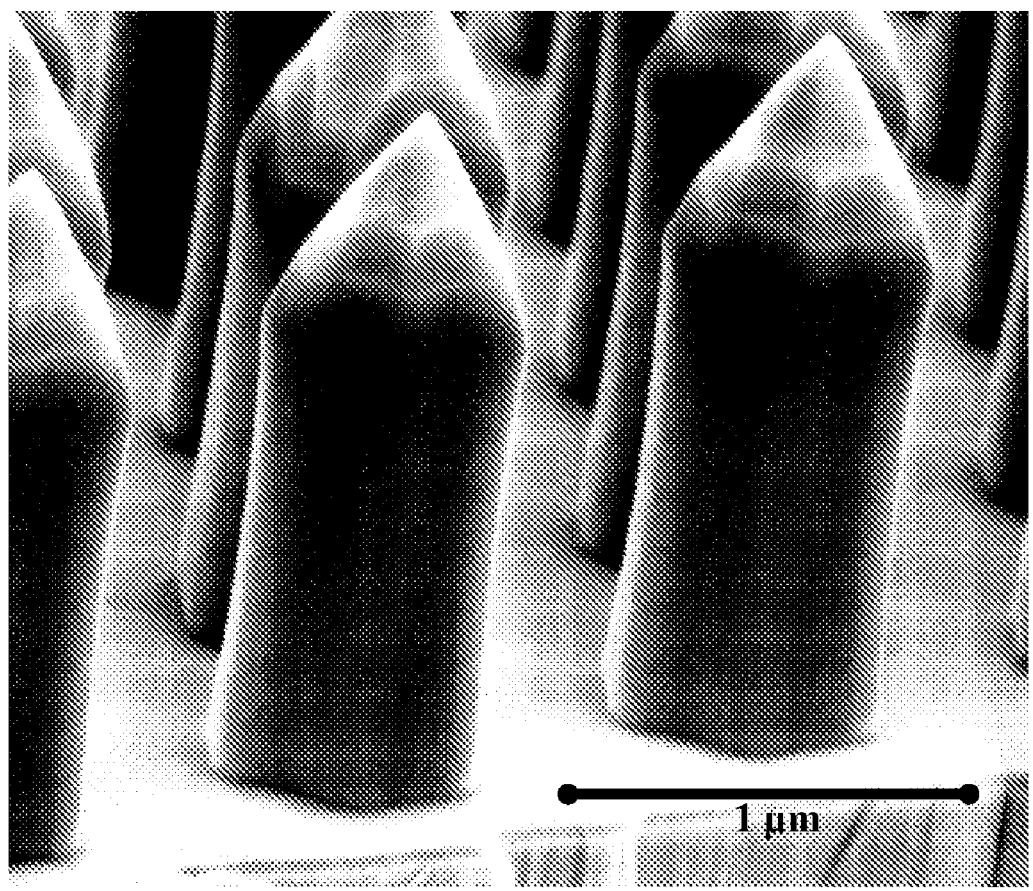

In the example of FIG. 9b a substrate with upstanding nanowires is provided. In a first step, a layer 25 and sacrificial layer 30 deposited isotropically. In a second step an anisotropic etching of sacrificial layer 30 is performed, acting mainly on the part of the layer parallel to the substrate 10, resulting in the layer 25 being exposed on the top surface of the nanowires 5 and on the substrate 10. In a third step the exposed parts of layer 25 are etched, the remains of sacrificial layer 30 acting as a mask. In an optional last step the remains of sacrificial layer 30 is selectively removed. FIG. 9c is a SEM-picture of nanowires with a deposited layer remaining on the vertical envelope surface, and with the horizontal layer removed.

Several useful features to such a technique include the following:
- The process is inherently self-aligned. The vertical sidewalls of the nanowires effectively creates the thickness variation with respect to an anisotropic etch.
- The technique may be used to form both metal and dielectric layers surrounding the nanowires.
- The remaining band or bands of deposited material are only found around the nanowires. The etch removes material on the surface between the nanowires. This may be useful for creating a gate dielectric only in a selective region on the nanowires, where a planar layer of the film is unwanted.
- Multiple layers of deposited materials may be used and combined with selective etches as illustrated in FIG. 9b.

The protruding structure 5 has in most cases for clarity reasons only been exemplified as homogenous in the radial direction. It should be noted that the protruding structure 5, for example a nanowire may comprise a radial heterostructure, for example concentric layers tailoring doping concentrations in the current channel. Also in these cases the ability afforded by the present invention to provide a precision layer forming for example the gate contact is of high value.

Layers formed by the method according to the invention may be made from, but is not limited to conducting materials suitable for contacts for example Au, Al, Cr, Cu, Pd, Mo, Ti, W, WN, TiN, TaN, HfN, MoN, silicides of: Ni, Al, Ir, Co, Ta, Pt, Pd, Ti, W, and Mo and insulating materials suitable for dielectric or spacer applications such as $CeO_2$, $Y_2O_3$, $Al_2O_3$, $SiO_2$, $SiN_x$, $HfO_2$, $HfLaO$, $ZrO_2$, $TaO_x$, PolySi.

Suitable materials for the substrate of the vertical semiconducting device include, but is not limited to: Si, GaAs, GaP, GaP:Zn, GaAs, InAs, InP, GaN, $Al_2O_3$, SiC, Ge, GaSb, ZnO, InSb, SOI (silicon-on-insulator), CdS, ZnSe, CdTe. Suitable materials for the protruding structure, for example a nanowire, include, but is not limited to IV, III-V, II-VI semiconductors such as: GaAs (p), InAs, Ge, ZnO, InN, GaInN, GaN AlGaInN, BN, InP, InAsP, GaInP, InGaP:Si, InGaP:Zn, GaInAs, AlInP, GaAlInP, GaAlInAsP, GaInSb, InSb and Si. It should be noted that the method and arrangement according to the present invention is well suited for production of devices based on nitrides such as GaN, InN and AlN characterized by a high bandgap. The nitrides facilitate fabrication of LEDs emitting light in wavelength regions not easily accessible by conventional technique, and transistors and diodes for high voltage and/or high power applications. Other combinations of particular commercial interest include, but are not limited to GaAs, GaInP, GaAlInP, GaP systems.

EXAMPLES OF FABRICATION

In one example of producing a vertical semiconductor using the method according to the invention matrices of nanowires were grown by chemical beam epitaxy (CBE) using patterned Au discs as catalysts. The discs were placed on a highly conducting InAs (111)-substrate using electron beam lithography and metal evaporation in a lift-off process. The wires had a separation of 1 μm (check) and the matrix consisted of 11×11 wires. After the patterning, the nanowires were grown using trimethylindium (TMIn) and pre-cracked tertiarybutylarsine (TBA) as source materials at a growth temperature of about 420° C. The typical growth rate was about 50 nm/min and the wires were not intentionally doped, but showed a n-type conduction with a carrier concentration about $1\text{-}5\times10^{17}$ $cm^{-3}$. The wires had a length of 3 μm and two types of designed and measured wires were used with 55 and 70 nm diameter, respectively. The diameters of the wires were set by the diameter of the Au disc and they were both processed in the same batch.

Figure 10:
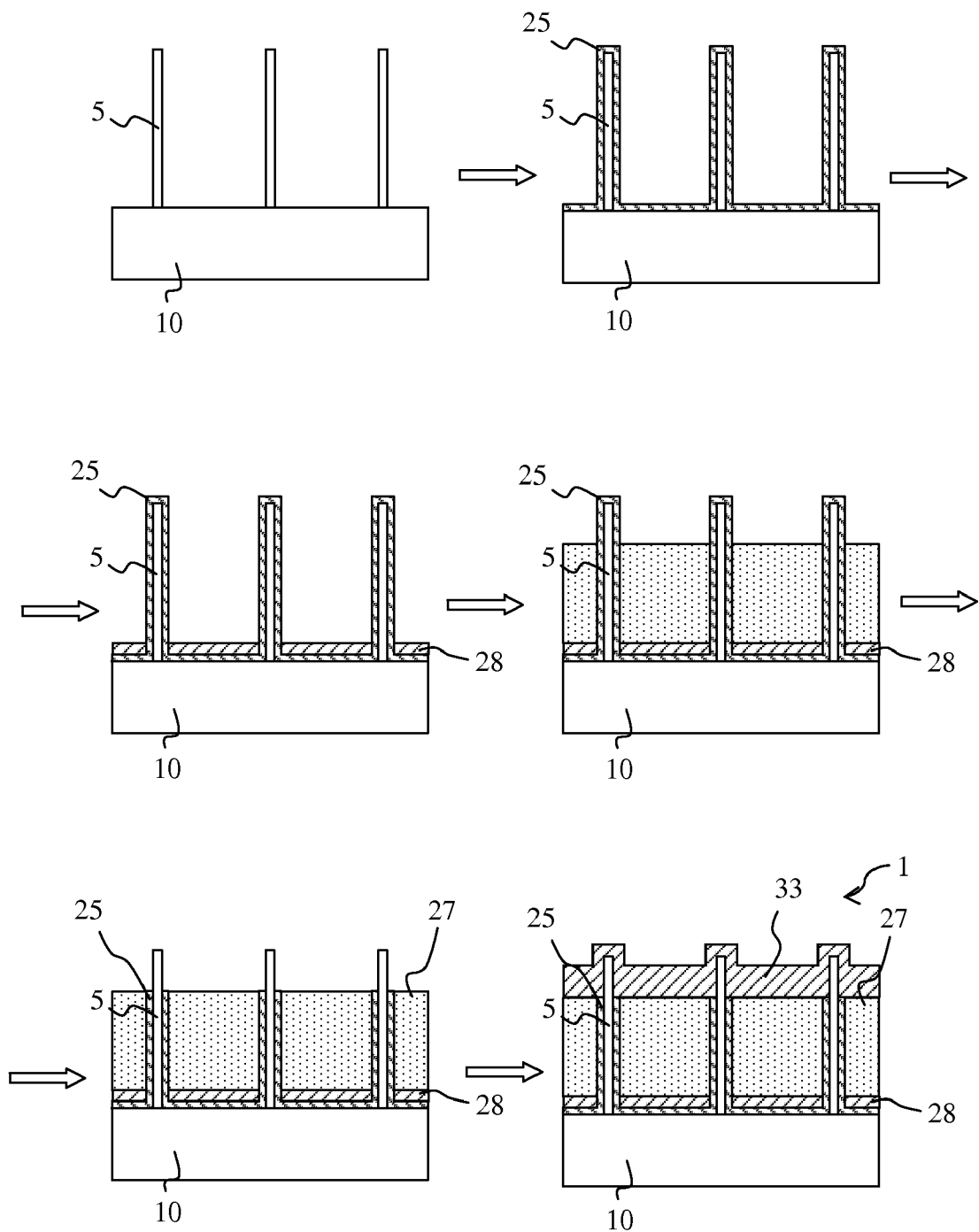
FIG. 10 illustrates the method of producing a gate layer according to one embodiment of the invention wherein the device comprises a plurality of nanowires.
Figure 11:
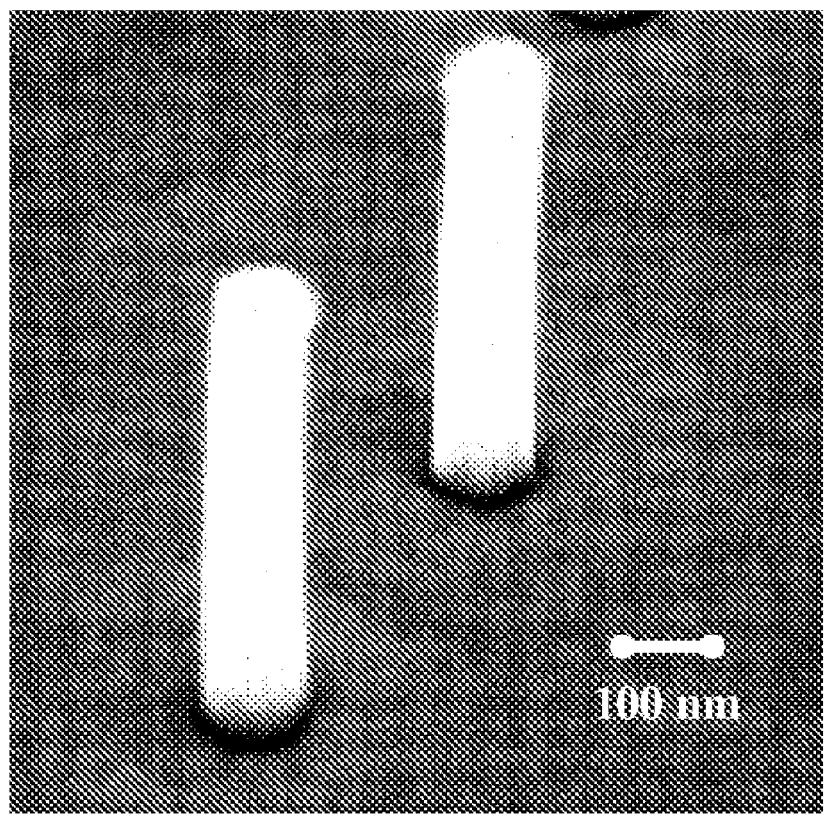
FIG. 11 is an example of nanowires that penetrate the gate metal layer after the metallization.

After the growth, the transistors were processed with the steps schematically illustrated in FIG. 10. First, a 40-nm-thick $SiN_x$ layer 25 was deposited using plasma enhanced CVD, PECVD. This nitride layer 25 acts both as a gate dielectric and as an insulation layer between the gate and the substrate. A 80-nm-thick Au layer 28 was then thermally evaporated on to the sample to form the gate. FIG. 11 shows nanowires 5 that penetrate the gate metal layer 28 after the metallization. From the image we conclude that the gate metal does not cover the sides of the wires, i.e. the gate length is not longer than the evaporated gate thickness. With this approach we directly control the gate length via the thickness of the deposited layer in stead of by lithographically means as in planar technologies. After careful inspection it looks like there is less metal close to the nanowires, which indicates that the gate length is shorter than the metal thickness. This may possibly lead to a reduced gate coupling, but since the transistors show good characteristics as shown next, this is not regarded as a serious problem. After the gate metallization, the gate was patterned by optical lithography combined with wet etching and it covered an area of 20×20 μm² in the wire matrix area that was connected to a 100×100 μm² external pad. The sample was spin-coated with 1-μm-thick BCB 27 that provides the insulation between the gate and the top drain contact 33. Notably, the wires were substantially longer than the thickness of the BCB layer 27 and hence the top of the wires were sticking out from the BCB layer 27. The $SiN_x$ layer 25 was then etched on the tips of the wires using buffered HF and a non-alloyed ohmic drain contact was formed by evaporation of Ti/Au. This layer covered the complete top of the wires above the BCB layer 27 (as seen by SEM inspection) and hence the contact area for the wires 5 was increased as the wires were physically penetrating the drain contact to reduce the ohmic contact resistance. Finally, patterning of the drain contact was done by wet etching of the Ti/Au contact layer to a size of 20×20 $\mu m^2$ above the matrix, and this area was electrically connected to a 100×100 $\mu m^2$ pad for probing. Notably, except for the fist pre-growth patterning, all steps were used by parallel and well-established processing techniques suitable for batch fabrication.

Figure 12A:
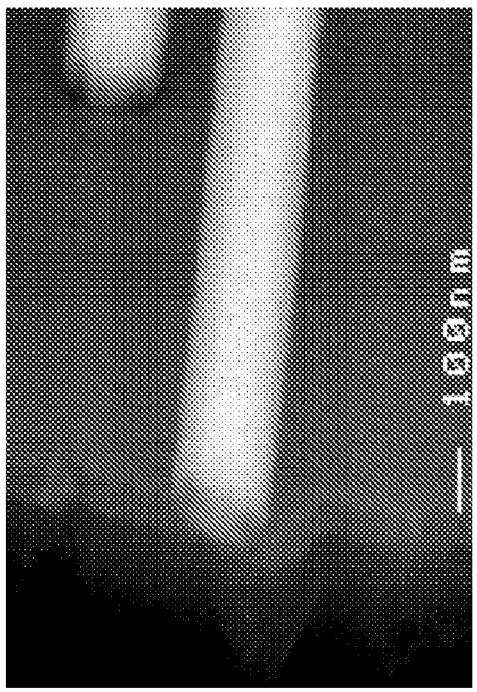
FIGS. 12a-f illustrates the steps of one embodiment of the method according to the present invention.
Figure 12B:
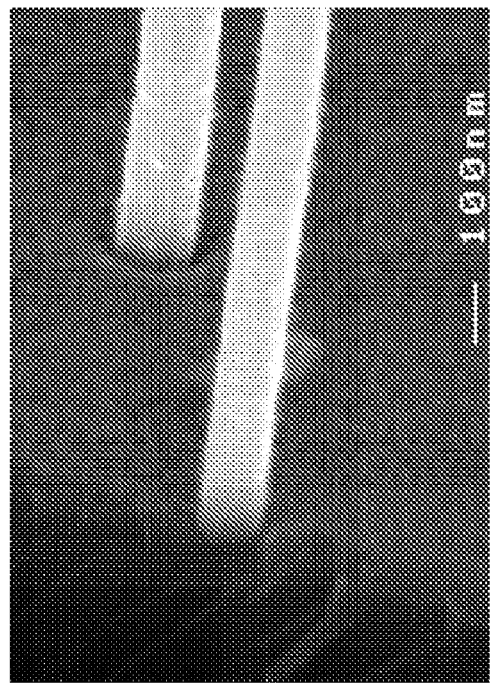
Figure 12C:
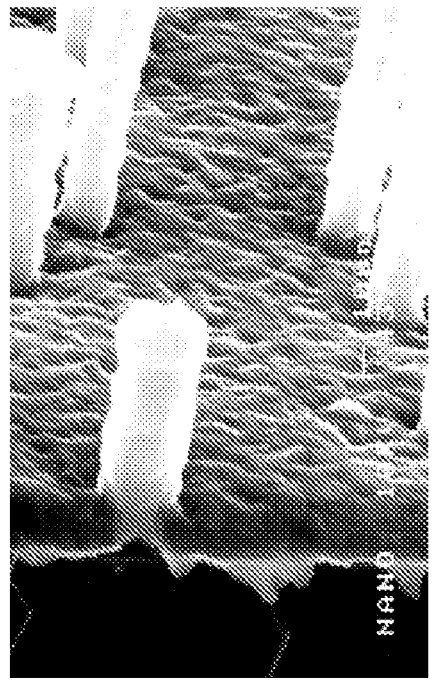
Figure 12D:
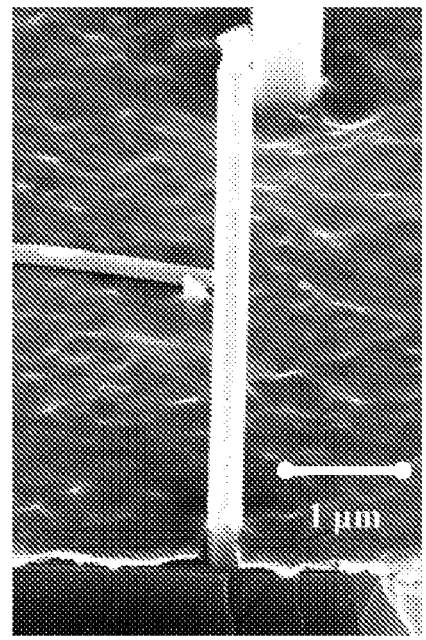
Figure 12E:
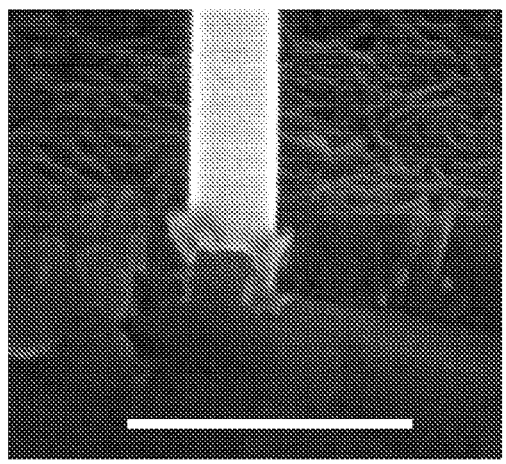
Figure 12F:
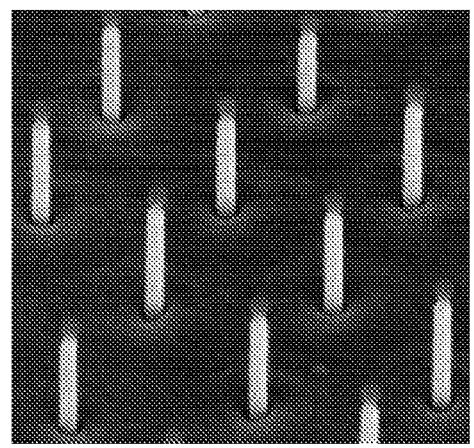
Figure 13:
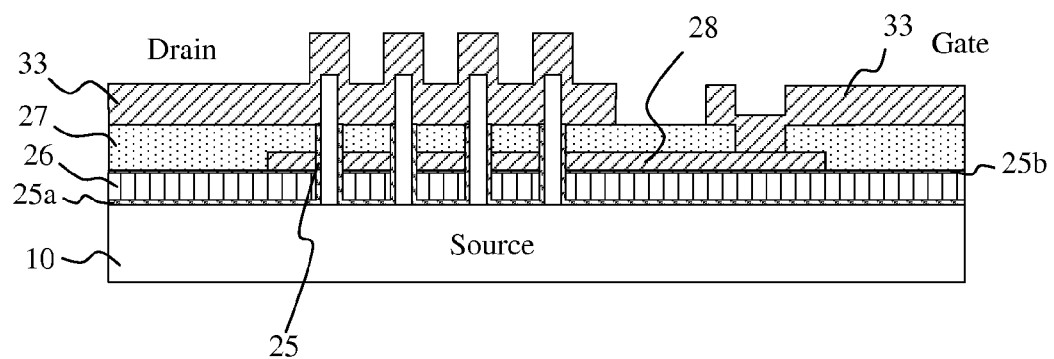
FIG. 13 illustrates schematically a vertical semiconductor device produced according to the steps of the method according to the invention.

The method according to the invention is further exemplified with the production of a plurality of FETs as illustrated in FIGS. 12a-f, and the resulting device is schematically illustrated in the cross-sectional view of FIG. 13. Matrices of nanowires are grown by chemical beam epitaxy (CBE) using patterned Au discs as catalysts. The discs are formed on a highly conducting InAs (111)-substrate using electron beam lithography and metal evaporation in a lift-off process. In this example the InAs substrate acts as one contact (source) in the transistor.

After growth, a 5 nm thick layer of $HfO_2$ 25a is deposited by atomic layer deposition (ALD) at 250° C. This is followed by tilted (15 deg.) evaporation of a 100 nm $SiO_x$ layer 26 with the samples rotating. FIG. 12a shows a sample after $SiO_2$-deposition. The purpose of the $SiO_x$ layer 26 is to lift the gate layer 28 approximately 100 nm from the substrate 10. The excess $SiO_x$, deposited onto the sides of the nanowires, is removed with HF. FIG. 12b shows the nanowires after removal of the $SiO_2$. This is followed by ALD of another 5 nm $HfO_2$ 25b that will encapsulate the relatively porous $SiO_x$ for further processing. This second $HfO_2$ layer 25b also partly fills the small cavities between the $SiO_x$ and the base of the nanowires. The $HfO_2$ layer 25 (with a total thickness of 10 nm), acts as gate dielectric.

Referring to FIG. 12c, a Cr gate layer 28 is deposited by tilted (10 deg.) evaporation of 50 nm Cr onto the rotating samples. This gives a high precision in the resulting gate length. Referring to FIG. 12d, excess material on the sides of the nanowires 5 is removed by a short Cr etch. FIG. 12e shows the gate after removal of the side-deposits for a test sample without the $SiO_x$ source-gate layer, FIG. 12f with the $SiO_x$. The brighter contrast in FIG. 12e corresponds to the 10 nm thick $HfO_2$. When the sample was cleaved, the Cr removed the $HfO_2$ it was in contact with. This clearly reveals the effective nanowire gate length, which for the case of FIG. 12e is 50 nm.

An organic insulating layer 27 based on a cross-polymerized photo-resist is used as gate-drain separation. The photo-resist is first patterned with UV-lithography for the gate-via. It is then cured and dry-etched to a desired thickness using oxygen plasma. The thickness of the fully processed layer is set by the time used for etch-back, which is varied depending on nanowire length. Typically the gate-drain separation is 100-200 nm.

The gate-drain insulation layer 27 also acts as an etch mask when removing the $HfO_2$ at the drain side, which is done with a Buffered HF wet-etch. After this, the drain is exposed to diluted $NH_4S_x$, which further removes oxides and also passivates the nanowire until the drain contact is processed. Again, the sample is tilted and rotated while evaporating a Ti and Au layer 33 to form the drain contact.

The invention claimed is:

1. A method of providing layers of different thickness on vertical and horizontal surfaces of a vertical semiconductor device comprising a substrate and a structure protruding from the substrate, the substrate providing a horizontal surface and the protruding structure providing a vertical surface, wherein the method comprises the steps of:
    depositing a layer material on both the vertical surface and the horizontal surface, wherein the deposited layer is a precision layer, and wherein the depositing is performed isotropically;
    removing the layer material from at least one of the vertical surface and the horizontal surface, wherein the removing of the layer material is anisotropic resulting in a deposited layer that is thinner on one of the vertical and horizontal surfaces than the other; and
    prior to the depositing the layer material:
        depositing a sacrificial layer;
        depositing a mold layer over the sacrificial layer;
        selectively removing at least one part of the mold layer; and
        selectively removing at least one part of the sacrificial layer.

2. The method according to claim 1, wherein the protruding structure is a nanoscaled structure grown on the substrate.

3. The method according to claim 1, wherein the vertical semiconductor device is a nanoscaled field effect transistor and the deposited layer is a gate electrode, and wherein the method further comprises controlling the deposition thickness of the gate electrode, which results in controlling a gate length.

4. A method of providing layers of different thickness on vertical and horizontal surfaces of a nanoscaled field effect transistor comprising a substrate and a structure protruding from the substrate, the substrate providing a horizontal surface and the protruding structure providing a vertical surface, wherein the method comprises the steps of:
    depositing a layer material on both the vertical surface and the horizontal surface, wherein the deposited layer is a gate electrode and wherein the method further comprises controlling the deposition thickness of the gate electrode, which results in controlling a gate length; and
    removing the layer material from at least one of the vertical surface and the horizontal surface, wherein at least one of the depositing and the removing of the layer material is anisotropic resulting in a deposited layer.

5. The method according to claim 4, wherein the deposited layer material is a precision layer and wherein said depositing is anisotropic depositing at an incident angle for the layer material that deviates from zero.

6. The method according to claim 4, wherein the depositing comprises an anisotropic evaporation or sputtering.

7. The method according to claim 4, wherein the protruding structure is a nanoscaled structure grown on the substrate.

8. The method according to claim 5, wherein the incident angle is larger than 0 and smaller than 45°.

9. The method according to claim 5, wherein said removing comprises etching the layer material from the protruding structure.

10. The method according to claim 9, wherein the etching is controlled to leave precision layer of a first final thickness in the direction perpendicular to the substrate and a second final thickness in a direction perpendicular to the protruding structure.

* * * * *